United States Patent [19]
Yamazaki

[11] Patent Number: 5,512,540
[45] Date of Patent: Apr. 30, 1996

[54] METHOD OF MANUFACTURING SUPERCONDUCTING PATTERNS

[75] Inventor: Shunpei Yamazaki, Tokyo, Japan

[73] Assignee: Semiconductor Energy Laboratory Co., Ltd., Kanagawa, Japan

[21] Appl. No.: 323,088

[22] Filed: Oct. 14, 1994

Related U.S. Application Data

[62] Division of Ser. No. 829,531, Feb. 3, 1992, Pat. No. 5,401,716, which is a continuation of Ser. No. 239,288, Sep. 1, 1988, abandoned.

[30] Foreign Application Priority Data

| Apr. 15, 1987 | [JP] | Japan | 62-93732 |
| Sep. 7, 1987 | [JP] | Japan | 62-223675 |
| Sep. 16, 1987 | [JP] | Japan | 62-231888 |

[51] Int. Cl.$^6$ .............. H01L 39/24; B05D 5/12
[52] U.S. Cl. .............. 505/325; 505/480; 505/329; 505/330; 505/702; 427/62; 427/63
[58] Field of Search .............. 505/325, 480, 505/702, 329, 330; 427/62, 63

[56] References Cited

U.S. PATENT DOCUMENTS

| 4,957,900 | 9/1990 | Yamazaki . |
| 4,960,751 | 10/1990 | Yamazaki . |
| 4,980,338 | 12/1990 | Yamazaki . |
| 5,026,682 | 6/1991 | Clark et al. ............... 505/701 |
| 5,051,396 | 9/1991 | Yamazaki . |
| 5,079,222 | 1/1992 | Yamazaki . |
| 5,098,884 | 3/1992 | Yamazaki . |

FOREIGN PATENT DOCUMENTS

| 1553945 | 10/1979 | United Kingdom . |

OTHER PUBLICATIONS

Koch et al., "Quantum Interference Devices from Superconducitng Oxide Thin Films", App. Phys. Lett. 51(3), Jul. 20, 1987, pp. 200–202.

Koch et al., "Thin Films and Squids Made From $YBa_2Cu_3O_y$," Presented at MRS Conf. Apr. 1987 p1–3.

Hisao Tanabe, et al., "Gran Boundary Josephson Junctions Using Y–Ba–Cu–O Films Operative at 77 K" J. App. Physics, Dec. 1987, pp. L1961–L1963.

Tsuyoshi Kajitani et al., Crystal Structures of $YBa_2Cu_{3-\delta}A_\delta O_{9-y}$ (A=Ni, Zn and Co) Jpn. J. of App. Phys. Mar. 1988 pp. L354–L357.

J. Van der Mass et al. "Improved Low Contact Resistance M High–Tc Y–Ba–Cu–0 Ceramic Superconductors" Nature vol. 328, Aug. 13, 1987, pp. 603–604.

Singh et al., "High–Temperature Superconductng Thin Films: High–Speed Electronics Perspective", American Vacuum Society Services, Nov. 6, 1987, pp. 211–220.

N. Braslau et al. "Fabrication of Planar Josephson Junctions by Laser Irradiation" IBM TDB, vol. 18, No. 11, Apr. 1986, pp. 3845–3846.

E. P. Harris, "Preparation of Superconducting Weak Links in Molybdenum Films by Ion Implantation", IEEE Transactions on Magnetics, Mar. 1975, pp. 785–788.

Youwen Xu et al. "Effects of Metal Substitutions (Fe and Ga) Im Y $Ba_2Cu_3O_7$ on its Superconducting Properties and Microstructures", Extended Abstracts, High–Temperature Superconductor II, Apr. 1988. No page number available.

Applied Physics Letters, "Quantum Interference Devices Made From Superconducting Oxide Thin Films"; vol. 51, No. 3, pp. 200–202, Jul. 20, 1987.

JP–A–57 270709 (Nippon Denshin Denwa Kosha) Feb. 13, 1982, Abstract.

Applied Physics Letters, vol. 26, No. 4, pp. 204–206: "Superconducting Weak Links Formed By Ion Implantation" FIG. 1; pp. 204, 205, Feb. 15, 1975.

*Primary Examiner*—Roy V. King
*Attorney, Agent, or Firm*—Sixbey, Friedman, Leedom & Ferguson; Gerald J. Ferguson, Jr.; Karlton C. Butts

[57] ABSTRACT

A manufacturing method of a superconducting pattern is described. A superconducting ceramic film is deposited on a non-conductive surface and partly spoiled in order to form a barrier film by which two superconducting regions is separated. The spoiling is performed by adding a spoiling element into the ceramic film by ion implantation.

28 Claims, 3 Drawing Sheets

METHOD OF MANUFACTURING SUPERCONDUCTING PATTERNS

This is a Divisional application of Ser. No. 07/829,531, filed Feb. 3, 1992 now U.S. Pat. No. 5,401,716; which itself is a continuation of Ser. No. 07/239,288, filed Sep. 1, 1988, now abandoned.

BACKGROUND OF THE INVENTION

This invention relates to a method of manufacturing superconducting patterns.

Along with efforts to make integrated circuits more dense, high operational speeds are required. The fine structures of electric circuits give rise to problems of decrease in operational speed and in reliability at exothermic parts of integrated circuits. Because of this, if semiconductor devices are driven at the boiling point of liquid nitrogen, the mobilities of electron and hole become 3–4 times as faster as those at room temperature and as a result the frequency characteristics can be improved.

The Josephson devices such as a memory which functions based on the Josephson effect are known as superconductive electronical devices. In this device, switching operation associated with the Josephson effect is performed. A schematic view of an example of such a device is shown in FIG. 1. The device comprising a superconducting film 24 adjoined to superconducting region formed within a substrate 21 with a barrier film 23 therebetween. The advantage of the device is operability at a very high frequency. However, the oxygen proportion contained in the superconducting ceramics of this type tend to be reduced.

SUMMARY OF THE INVENTION

It is therefore an object of the invention to provide a method of effectively manufacturing superconducting patterns.

It is another object of the present invention to provide a method of manufacturing superconducting patterns at high production yield.

In order to accomplish the above and other objects and advantages, non-superconducting regions are performed within ceramic superconductors by adding an element which functions to spoil the superconducting structure of the ceramics and insulating the same. The non-superconducting region is thermal annealed or fired. When a superconducting film is formed on a surface, the (a,b) plane in the crystalline film is aligned parallel to the underlying surface because current can flow along that plane 100 time as dense as along the normal direction thereto.

Preferred examples of the elements to be added to superconducting ceramics for the purpose of converting the superconducting structure to insulating non-superconducting structure are Si, Ge, B, Ga, P, Ta, Mg, Be, Al, Fe, Co, Ni, Cr, Ti, Mn and Zr. Preferred examples of the superconducting ceramic materials used in accordance with the present invention are represented by the stoichiometric formula, $(A_{1-x}B_x)_yCu_zO_w$, where A is one or more elements of Group IIIa of the Periodic Table, e.g., the rare earth elements or lantanoides, B is one or more alkaline earth metals, i.e. Ba, Sr and Ca, and x=0–1; y= 2.0–4.0, preferably 2.5–3.5; z=1.0–4.0, preferably 1.5–3.5; and w=4.0–10.0, preferably 6.0–8.0. When added to superconducting ceramics of this type, the spoiled non-superconducting ceramics are represented by the stoichiometric formula, referred to "non-superconducting ceramics" hereinafter, $[(A'_pA''_{1-p})_{1-x}(B'_qB''_{1-q})x]_y(Cu_rX_{1-r})_zO_w$, where A' is one or more elements of Group IIIa of the Periodic Table, e.g., the rare earth elements or lantanoides, B' is one or more alkaline earth metals, i.e. Ba, Sr and Ca, A", B" and X are selected from a group consisting of Mg, Be, Al, Fe, Co, Ni, Cr, Ti, Mn and Zr, and x=0.1–1; y=2.0–4.0, preferably 2.5–3.5; z=1.0–4.0, preferably 1.5–3.5; and w=4.0–10.0, preferably 6.0–8.0. The numbers p, q and r are chosen to be 0.99 to 0.80 so that the total proportion of A", B" and X is 1–25 atom % in the ceramic material, particularly in case of Mg and Al, the proportion may be 1–10atom %, e.g. 5–10 atom %. The total density of the spoiling elements in a non-superconducting ceramic is about $5 \times 10^{18}$ to $6 \times 10^{21}$ cm$^{-3}$. Since the superconducting properties of superconducting ceramics are sensitive to proportion of their constituents, the spoiling element can be selected from among the constituents of themselves. When superconducting constituents are employed as the spoiling element, the total density of the additional is $5 \times 10^{19}$ to $5 \times 10^{22}$ cm$^{-3}$.

DETAILED DESCRIPTION OF THE PREFERRED EMBODIMENTS

Figure 2A:
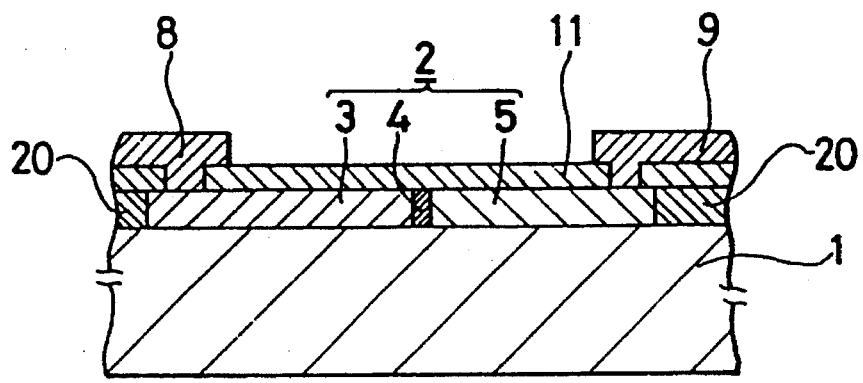
FIGS. 2(A), 2(B) and 2(C) are cross sectional views showing first, second and third embodiments in accordance with the present invention.
Figure 2B:
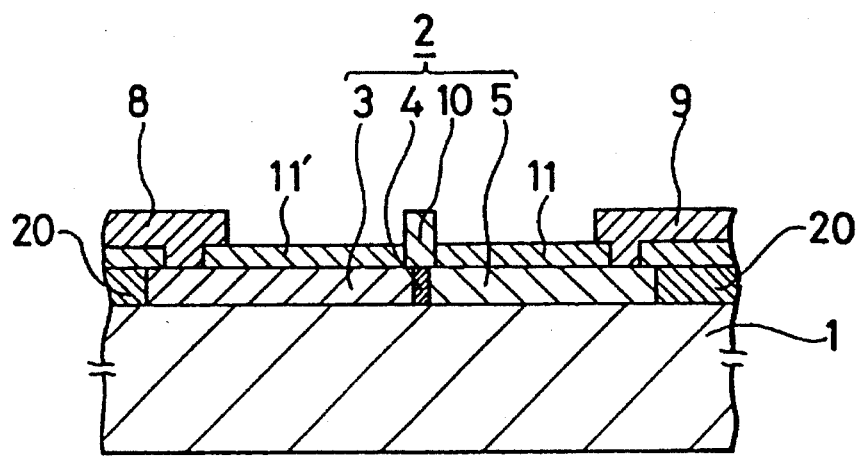
Figure 2C:
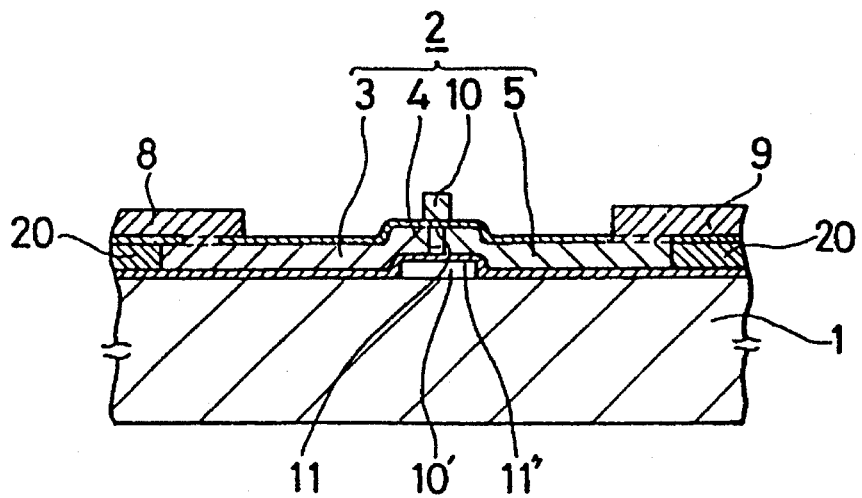

Referring to FIGS. 2(A) to 2(C), superconducting devices in accordance with the present invention is illustrated.

The device shown in FIG. 2(A) comprises a substrate 1 having a non-conductive upper surface such as a substrate of YSZ(yttria stabilized zircon), a pair of superconducting regions 3 and 5, an intervening barrier film 4 between the regions 3 and 5, insulating films 20 positioned at the opposed ends of the superconducting regions 3 and 5, an overlying passivation film 11 formed with openings 11-1 and 11-2 2 at the regions 3 and electrodes 8 and 9 electrically contacting the superconducting regions 3 and 5.

An exemplary method of manufacturing the device will be described. First, a ceramic oxide film of composition in agreement with the composition of a superconducting material as specifically stated in the last portion of this description is formed on the substrate 1 by screen printing, sputtering, MBE (Molecular Beam Epitaxial), CVD and the other methods. At the same time or thereafter, the ceramic oxide is thermally annealed at 600°–950° C. for 5–20 hours followed by gradually cooling. In accordance with experimental, the critical temperature was measured to be 91K for example.

The barrier film 4 is formed after or before the annealing by adding a spoiling element such as aluminium or magnesium by ion implantation to $5 \times 10^8$–$6 \times 10^{21}$ cm$^{-3}$, e.g. $2 \times 10^{20}$ cm$^{-3}$. This ion implantation is performed at an accelation voltage of 50–2000 V with a photoresist mask covering the superconducting regions 3 and 5 so that the barrier film 4 and the insulating films 20 become "non-superconducting." The barrier film 4 is no wider than 1000 Å in the lateral direction in order to permit tunnel current thereacross.

Figure 1:
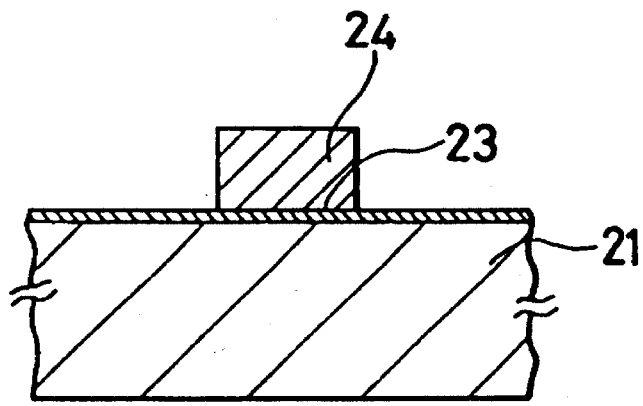
FIG. 1 is a schematic view showing a prior art superconducting device.
Figure 3:
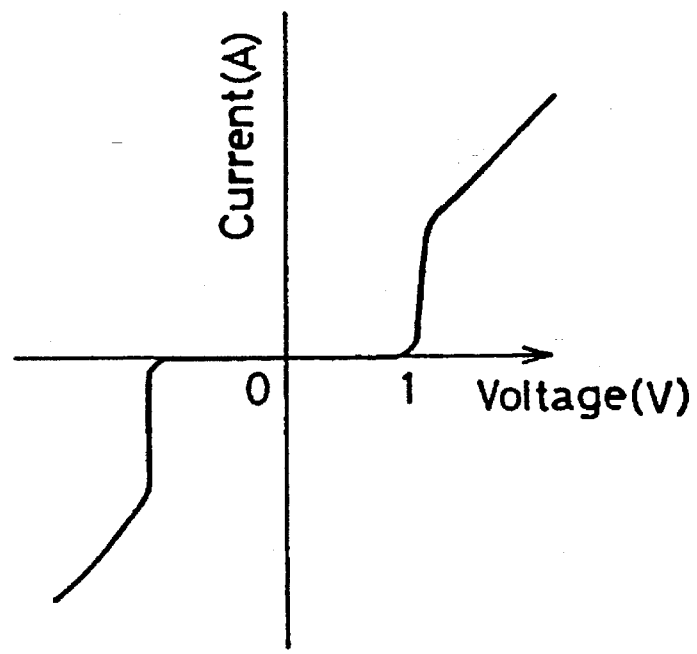
FIG. 3 is a graphical diagram showing the current voltage characteristic of devices in accordance with the present invention.

The passivation film 11 of an insulating ceramic having similar composition as the underlying superconducting ceramic film is formed over the structure, followed by oxidation in an oxidizing atmosphere at 300°–950° C., e.g. 700° C. for the purpose of fitting the films of the structure together and compensating the oxygen proportion at the surface area. The passivation film 11 is spoiled in the same manner or formed by making use of a spoiled composition. The spoiling element is oxidized during this oxidation process. Then, after forming the openings 11–1 and 11–2, the lead electrodes 8 and 9 is formed in ohmic contact with the superconducting regions 3 and 5 respectively. The electrodes 8 and 9 may be formed of superconducting ceramics. In that case, the formation of the electrodes is preferably carried out before the annealing. FIG. 3 is an example of the voltage-current characteristic of the devices in accordance with the present invention.

In the previous example, the densities of the spoiling element in the barrier film 4 and the insulating films 20 are same. However, by separately effecting ion implantation, the films 4 and 20 can be formed so that the density of the barrier film is 0.1 to 20atom % which is 1/10–1/3, e.g. 1/5, of the density of the insulating films.

Referring to FIG. 2(B), a second embodiment of the present invention is illustrated. This embodiment is approximately same as the previous embodiment except for a control electrode 10 formed over the barrier film 4 with the insulating film 11 therebetween. The current passing through the barrier film 4 is controlled by the applied voltage by the control electrode 10. In this embodiment, the barrier film 4 may be superconducting. In that case, the operation temperature of the device should be selected so that the superconducting barrier film 4 is in an intermediate mediate state between superconducting state and non-superconducting state. Namely, the temperature is selected within the range from Tc onset and Tco. The action of the device is described in our U.S. patent application Ser. No. 167,987 filed on 14th/03/88.

Referring to FIG. 2(C), a third embodiment is illustrated. This device is approximately same as the second embodiment except for provision of an underlying control electrode 10'. The barrier film 4 is sandwiched by the overlying control film 10 and the underlying control film 10'.

Figure 4A:
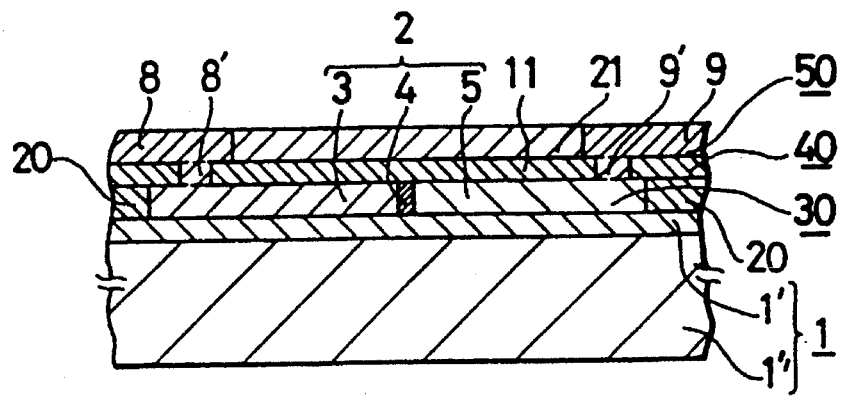
FIGS. 4(A), 4(B) and 4(C) are cross sectional views showing first, second and third embodiments in accordance with the present invention.
Figure 4B:
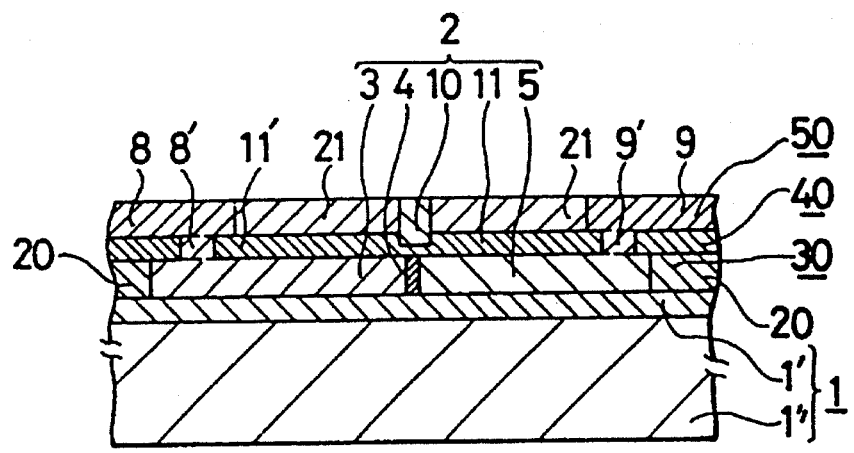
Figure 4C:
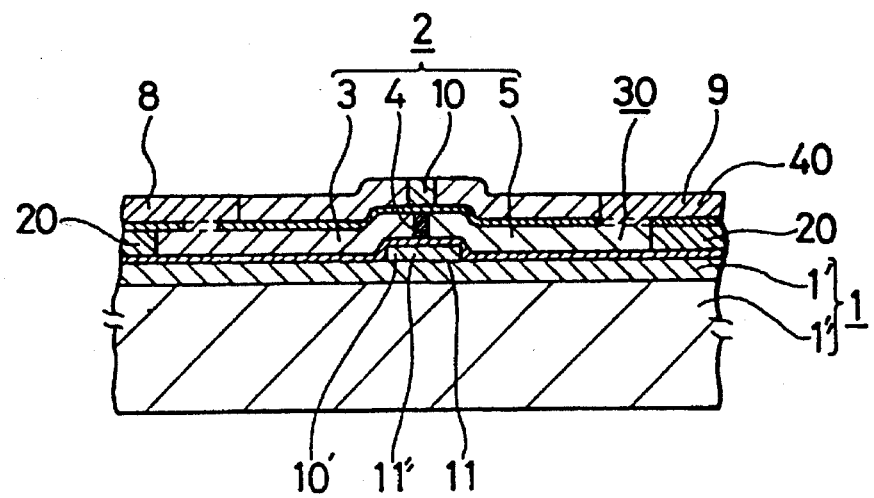

FIGS. 4(A) to 4(C) are modifications of the preceding embodiments shown in FIGS. 2(A) to 2(C) respectively. These embodiments are constructed in substantially same manner with the exception specified as below.

FIG. 4(A) is a cross section view showing a fourth embodiment of the present invention. The substrate 1" is a proportion of a silicon semiconductor substrate within which an integrated circuit is formed. The upper surface of the substrate 1" is made non-conductive by covering a ceramic oxide film 1'. After forming the superconducting regions 3 and 5, the barrier film 4 and the insulating films 20 on the substrate in the same manner, a superconducting ceramic oxide film 40 is formed and partly made non-superconducting by adding a spoiling element thereto except for connection portions 8' and 9'. Further, a superconducting ceramic film 50 is formed on the structure of the film followed by spoiling the superconducting structure except for the electrodes 8 and 9. Although the fabricating process substantially corresponds to that of preceding embodiments, the electrodes 8 and/or 9 which may be connected with the integrated circuit have not to be given thermal treatment at no lower than 400° C. in order to avoid oxidation of the silicon semiconductor by the oxygen content of the superconducting electrodes 8 and 9.

Referring to FIG. 4(B), a fifth embodiment of the present invention is illustrated. This embodiment is approximately same as the fourth embodiment except for a control electrode 10 made of a superconducting ceramic formed over the barrier film 4 with the insulating film 11 therebetween. The current passing through the barrier film 4 is controlled by the applied voltage by the control electrode 10. In this embodiment, the barrier film 4 may be superconducting. The operation temperature of the device should be selected so that the superconducting barrier film 4 is in an intermediate state between superconducting state and non-superconducting state. Namely, the temperature is selected within the range from Tc onset and Tco.

Referring to FIG. 4(C), a sixth embodiment is illustrated. This device is approximately same as the fifth embodiment except for provision of an underlying control electrode 10'. The barrier film 4 is sandwiched by the overlying control film 10 and the underlying control film 10'.

Superconducting ceramics for use in accordance with the present invention also may be prepared in consistence with the stoichiometric formulae $(A_{1-x}B_x)_yCu_zO_w$, where A or more elements of Group IIIa of the Periodic Table, e.g., the rare earth elements, B is one or more elements of Group IIa of the Periodic Table, e.g., the alkaline earth metals including beryllium and magnesium, and x=0–1; y=2.0–4.0, preferably 2.5–3.5; z=1.0–4.0, preferably 1.5–3.5; and w=4.0–10.0, preferably 6.0–8.0. Also, superconducting ceramics for use in accordance with the present invention may be prepared consistent with the stoichiometric formulae $(A_{1-x}B_x)_yCu_zO_w$, where A is one or more elements of Group Va of the Periodic Table such as Bi, Sb and As, B is one or more elements of Group IIa of the Periodic Table, e.g., the alkaline earth metals including beryllium and magnesium, and x=0.3–1; y=2.0–4.0, preferably 2.5–3.5; z=1.0–4.0, preferably 1.5–3.5; and w=4.0–10.0, preferably 6.0–8.0. Examples of this general formula are $BiSrCaCuCu_2O_x$ and $Bi_4Sr_3Ca_3Cu_4O_x$. Tc onset and Tco samples confirmed consistent with the formula $Bi_4Sr_yCa_3Cu_4O_x$ (y is around 1.5) were measured to be 40°–60° K., which is not so high. Relatively high critical temperatures were obtained with samples conforming to the stoichiometric formulae $Bi_4Sr_4Ca_2Cu_4O_x$ and $Bi_2Sr_3Ca_2Cu_2O_x$. FIGS. 7 and 8 are graphical diagrams showing the relationship between the resistivity and the temperature for both samples. The number x denoting the oxygen proportion is 6–10, e.g. around 8.1. Such superconducting materials can be formed by screen press printing, vacuum evaporation or CVD.

While a description has been made for several embodiments, the present invention should be limited only by the appended claims and should not be limited by the particular examples. For example, the present invention can be applied for SQUIDs, VLSIs or ULSIs. The superconducting ceramics in accordance with the present invention may have single crystalline or polycrystalline structures.

I claim:

1. A method of forming an electrical device comprising:

forming an oxide superconducting film on a surface of a substrate;

treating said superconducting film to establish a superconducting crystalline structure having a C-plane thereof oriented parallel to the surface of the substrate;

doping a selected portion of the superconducting film with a metal or semiconductor dopant in order to decrease the superconductivity of said selected portion; and forming a control electrode, wherein said control electrode overlies said selected portion of the superconducting structure.

2. The method as defined in claim 1, further comprising the step of forming an insulating layer on said superconducting film, such that said insulating layer is positioned between said selected portion and said control electrode.

3. The method of claim 1, wherein said oxide superconducting film is separated into two parts with said selected portion therebetween.

4. The method as defined in claim 1, wherein said selected portion is doped by ion implantation.

5. The method as defined in claim 1, wherein said selected portion is doped by ion implantation to a density of $5 \times 10^{18}$–$6 \times 10^{21}$ cm$^{-3}$.

6. The method as defined in claim 1, wherein said dopant is selected from the group consisting of Si, Ge, B, Ga, Ta, Mg, Be, Al, Fe, Co, Ni, Cr, Ti, Mn and Zr, and mixtures thereof.

7. The method as defined in claim 1, wherein said oxide superconducting film is formed of a superconducting ceramic material satisfying a stoichiometric formula;

$$(A_{1-x}B_x)_y Cu_z O_w$$

where A is at least one element of Group Va of the Periodic table, B is at least one element of Group IIa of the Periodic table, x=0.3–1.0, y=2.0–4.0, Z=1.0–4.0 and w=4.0–10.0.

8. The method of claim 7, wherein said superconducting ceramic material is of a single crystalline structure.

9. The method of claim 7, wherein said superconducting ceramic material is of a polycrystalline structure.

10. A method of forming an electrical device comprising:

forming a first control electrode on a portion of a surface of a substrate;

forming an oxide superconducting film on the surface of the substrate and overlying said first electrode;

treating said superconducting film to establish a superconducting crystalline structure having a C-plane thereof oriented parallel to the surface of the substrate;

doping a selected portion of the superconducting film which overlies said first electrode with a semiconductor or metal dopant in order to decrease the superconductivity of said selected portion; and forming a second control electrode, wherein said second control electrode overlies said selected portion of the superconducting structure.

11. The method as defined in claim 10, further comprising the step of forming an insulating layer between said first control electrode and said selected portion and forming an insulating layer between said selected portion and said second control electrode.

12. The method of claim 10, wherein said oxide superconducting film is separated into two parts with said selected portion therebetween.

13. The method as defined in claim 10, wherein said selected portion is doped by ion implantation.

14. The method as defined in claim 10, wherein said selected portion is doped by ion implantation to a density of $5 \times 10^{18}$–$6 \times 10^{21}$ cm$^{-3}$.

15. The method as defined in claim 10, wherein said dopant is selected from the group consisting of Si, Ge, B, Ga, Ta, Mg, Be, Al, Fe, Co, Ni, Cr, Ti, Mn and Zr, and mixtures thereof.

16. The method as defined in claim 10, wherein said oxide superconducting film is formed of a superconducting ceramic material satisfying a stoichiometric formula $$(A_{1-x}B_x)_y Cu_z O_w$$

where A is at least one element of Group Va of the Periodic table, B is at least one element of Group IIa of the Periodic table, x=0.3–1.0, y=2.0–4.0, Z=1.0–4.0 and w=4.0–10.0.

17. The method of claim 16, wherein said superconducting ceramic material is of a single crystalline structure.

18. The method of claim 16, wherein said superconducting ceramic material is of a polycrystalline structure.

19. A method of producing a superconducting pattern comprising:

forming an oxide superconducting film on a substrate;

treating said superconducting film to establish a superconducting crystalline structure having a C plane oriented parallel to the surface of the substrate; and doping a selected portion of the superconducting structure with a semiconductor or metal dopant in order that the superconductivity in said portion is decreased, wherein said doped portion is in the form of a barrier layer to separate said oxide superconducting film into two parts; and wherein the thickness of said doped portion is thin enough so that a current can pass therethrough.

20. The method of claim 1 wherein said superconducting film is treated thermally to establish said superconducting structure.

21. The method of claim 10, wherein said superconducting film is treated thermally to establish said superconducting structure.

22. The method of claim 19, wherein said superconducting film is treated thermally to establish said superconducting structure.

23. A method of forming an electrical device comprising:

preparing an oxide superconducting film;

doping a selected portion of the superconducting film with a semiconductor or metal dopant in order to decrease the superconductivity of said selected portion; and forming a control electrode, wherein said control electrode overlies said selected portion of the superconducting structure.

24. The method of claim 23 wherein said dopant is selected from the group consisting of Si, Ge, B, Ga, Ta, Mg, Be, Al, Fe, Co, Ni, Cr, Ti, Mn and Zr, and mixtures thereof.

25. A method of forming an electrical device comprising:

forming an oxide superconducting film on a surface of a substrate;

treating said superconducting film to establish a superconducting crystalline structure having a C-plane thereof oriented parallel to the surface of the substrate;

doping a selected portion of the superconducting film with phosphorus in order to decrease the superconductivity of said selected portion; and forming a control electrode, wherein said control electrode overlies said selected portion of the superconducting structure.

26. A method of forming an electrical device comprising:

forming a first control electrode on a portion of a surface of a substrate;

forming an oxide superconducting film on the surface of the substrate and overlying said first electrode;

treating said superconducting film to establish a superconducting crystalline structure having a C-plane thereof oriented parallel to the surface of the substrate;

doping a selected portion of the superconducting film which overlies said first electrode with phosphorus in order to decrease the superconductivity of said selected portion; and forming a second control electrode, wherein said second control electrode overlies said selected portion of the superconducting structure.

27. A method of producing a superconducting pattern comprising:

forming an oxide superconducting film on a substrate;

treating said superconducting film to establish a superconducting crystalline structure having a C plane oriented parallel to the surface of the substrate; and doping a selected portion of the superconducting structure with phosphorus in order that the superconductivity in said portion is decreased, wherein said doped portion is in the form of a barrier layer to separate said oxide superconducting film into two parts; and wherein the thickness of said doped portion is thin enough so that a current can pass therethrough.

28. A method of forming an electrical device comprising:

preparing an oxide superconducting film;

doping a selected portion of the superconducting film with phosphorus in order to decrease the superconductivity of said selected portion; and forming a control electrode, wherein said control electrode overlies said selected portion of the superconducting structure.

* * * * *